United States Patent [19]

Leenders et al.

[11] Patent Number: 5,360,781
[45] Date of Patent: Nov. 1, 1994

[54] HEAT MODE RECORDING MATERIAL AND METHOD FOR OBTAINING COLOR IMAGES

[75] Inventors: Luc Leenders, Herentals; Dirk D'hont, Mortsel, both of

[73] Assignee: Agfa-Gevaert, N.V., Mortsel,

[21] Appl. No.: 75,099

[22] Filed: Jun. 11, 1993

[30] Foreign Application Priority Data

Aug. 3, 1992 [EP] European Pat. Off. ........ 92202391.6

[51] Int. Cl.⁵ .................... B41M 5/035; B41M 5/38
[52] U.S. Cl. ................................ 503/227; 428/195; 428/207; 428/913; 428/914; 430/200; 430/945
[58] Field of Search .................. 8/471; 428/195, 207, 428/913, 914; 430/200, 945; 503/227

[56] References Cited

U.S. PATENT DOCUMENTS 5,192,738  3/1993  Inagaki et al. ................... 503/227

Primary Examiner—B. Hamilton Hess
Attorney, Agent, or Firm—Breiner & Breiner

[57] ABSTRACT

The present invention provides a method for obtaining an image comprising the steps of:

image-wise exposing to intense radiation a heat mode recording material comprising on a support (i) a donor layer containing an image forming substance capable of being transferred upon heating to an image receiving material, (ii) a barrier layer being impermeable for said image forming substance and overlaying said donor layer, and (iii) a light-to-heat converting substance, capable of absorbing the light used for exposing said heat mode recording material and releasing the absorbed energy under the form of heat, rubbing, under dry conditions or with the aid of a non-solvent for the barrier layer, the thus obtained image-wise exposed heat mode recording material to remove said barrier layer at the exposed parts and overall heating the exposed heat mode recording material whilst in contact with an image receiving material thereby causing an image-wise transfer of said image forming substance to said image receiving material.

9 Claims, No Drawings

HEAT MODE RECORDING MATERIAL AND METHOD FOR OBTAINING COLOR IMAGES

DESCRIPTION

1. Field of the Invention

The present invention relates to a heat mode recording material that may serve for preparing images, more particularly for preparing color images.

2. Background of the Invention

The production of color images representing linework or halftone multicolor colloid patterns is of interest in the field of design, e.g. in the production of color decorative patterns, color wiring and circuit diagrams, cartography, color proofing and the preparation of transparencies for transmission projection or production of images on reflective base for overhead projection.

Photographically produced color proofs are a substitute for multicolor halftone reproductions as will be produced by successive printing in register with the separate standard inks: magenta, yellow, cyan and black on a conventional printing press.

Press proofing for the production of color proofs by preparing a printing plate and running the plate on the press to produce only a few copies as proof of the quality of the halftone separation transparencies used in the plate production is a very expensive procedure and therefore photographic processes have been developed to obtain a similar result by means of which the appearance of a print obtained from particular color separation negatives or positives can be judged by the printer and client.

Examples of processes for the production of multicolor relief patterns using the transfer of colored colloid layers from a temporary support onto a permanent support are described e.g. in U.S. Pat. Nos. 3,642,474, 4,701,401 and 4,710,444. In such processes the multicolor pattern is formed by superposed relief patterns obtained by wash-off processing which is ecologically disadvantages. Furthermore, the relief patterns are obtained from light sensitive imaging elements which require handling in the dark.

To overcome the disadvantage of wash-off processing use can be made of recording elements that can be developed by means of dry processing steps such as e.g. development by application of heat and/or pressure. For example, several methods are known for transferring heat-diffusible dye from an overall heated element comprising such dye in combination with an image-wise distribution of photopolymerized areas and unpolymerized areas onto a receiving element, the photopolymerized areas inhibiting or reducing the diffusion of the dye to the receiving element.

It is for instance known from U.S. Pat. No. 3,245,796 to use a photopolymerizable element comprising a mixture of an $\alpha,\beta$-ethylenically unsaturated compound and a sublimable dye for forming by photo-initiated addition polymerization of said $\alpha,\beta$-ethylenically unsaturated compound a mask containing insoluble areas, through which the passage of the sublimable dye is impeded, and to overall heat the mask-containing element while in contact with a receptor surface so that transfer of the sublimable dye from the non-polymerized areas to the contacting receptor surface can take place.

In U.S. Pat. No. 4,587,198 a process has been described for providing a colour image comprising exposing a photoresist-type material comprising in the order given a support, a vapour-deposited dye or pigment layer, and a radiation-sensitive coating to an image-wise distribution of radiation that alters the solubility and/or permeability of said coating and uniformly heating said material while in contact with a receptor to evaporate said sublimable dye or pigment and deposit it on the contacting receptor.

In EP-A 362,827 an image-forming method has been described, which comprises the steps of using an image-forming medium containing a heat-diffusible colouring matter, a polymerizable polymer precursor, and a polymerization initiator, causing the polymerizable polymer precursor to image-wise polymerize, and heating the imaged medium while in contact with a receiving medium to diffusion-transfer the heat-diffusible colouring matter thereto, the heating being such as to satisfy the formula $Tg1 \leq Ttrans \leq Tg2$, wherein Ttrans represents the temperature of the image-forming medium, Tg1 represents the glass transition temperature of unpolymerized areas, and Tg2 the glass transition temperature of polymerized areas.

On the other hand heat mode recording materials or heat sensitive materials for obtaining color images are known. For example, according to the thermal dye transfer method a dye,. generally a sublimating dye, is image-wise transferred upon application of a heat pattern to an image receiving material.

According to EP-A-489972 images can be obtained using a heat mode recording material containing on a support a colorant layer containing a dye or dye precursor with on top thereof an ablatable metal layer, e.g. a vacuum deposited bismuth layer. Upon imaging with a laser the metal layer is locally destroyed so that at these parts the dye or dye precursor in the underlaying colorant layer can be transferred upon overall heating to an image receiving element while at the other parts the metal layer will inhibit the transfer of dye or dye precursor to the image receiving element. However the ablatable metal layer is easily damaged and as a consequence dye transfer at unwanted areas may occur.

SUMMARY OF THE INVENTION

It is an object of the present invention to provide an improved heat mode recording material for making images especially color images.

It is a further object of the present invention to provide a method for obtaining images, especially color images using a heat mode recording material.

Further objects of the present invention will become clear from the description hereinafter.

According to the present invention there is provided a method for obtaining an image comprising the steps of:

image-wise exposing to intense radiation a heat mode recording material comprising on a support (i) a donor layer containing an image forming substance capable of being transferred upon heating to an image receiving material, (ii) a barrier layer being impermeable for said image forming substance and overlaying said donor layer, and (iii) a light-to-heat converting substance, capable of absorbing the light used for exposing said heat mode recording material and releasing the absorbed energy under the form of heat, rubbing the thus obtained image-wise exposed heat mode recording material to remove said barrier layer at the exposed parts and overall heating the exposed heat mode recording material whilst in contact with an image receiving material thereby causing an image-wise transfer of said image forming substance to said image receiving material.

According to the present invention there is provided a heat mode recording material comprising on a support in the order given a donor layer containing an image forming substance capable of being transferred upon heating to an image receiving material, a recording layer containing a light-to-heat converting substance capable of absorbing the light used for exposing said heat mode recording material and releasing the absorbed energy under the form of heat and a barrier layer being impermeable for said image forming substance.

DETAILED DESCRIPTION OF THE INVENTION

The images obtained with the heat mode recording material and method of the present invention are of high quality i.e. high sharpness, high resolution, high density and contrast and a low fogging. Further said heat mode recording material is not susceptible to damaging during handling.

Barrier layers suitable for use in connection with this invention are layers being impermeable for the image forming substance so that transfer of said image forming substance is sufficiently inhibited at the non-exposed parts during the overall heating of the heat mode recording material whilst in contact with the receiving material. The barrier layer in connection with the present invention should further become permeable at the exposed or sufficiently exposed parts after exposure of the heat mode recording material to intense radiation and rubbing of the heat mode recording material. Most suitable barrier layers are those which are decomposed at the exposed parts upon exposure of the heat mode recording material to intense radiation and the heat generated therewith at said exposed parts. With the term "sufficiently inhibited" is meant that the amount of image forming substance that may be transferred at the non-exposed parts (unwanted) is such that the obtained density at the corresponding areas on the image receiving material is less than 0.3 and more preferably less than 0.1.

A most preferably used barrier layer in accordance with the present invention contains a hardened silicone resin. Such barrier layer, when being a surface layer, has the additional benefit that it can be used in a driographic printing process after imaging. Thus with the same process an image suitable for proofing and a lithographic printing plate can be obtained. However other barrier layers containing e.g. gelatin, cellulose, cellulose esters e.g. cellulose acetate, nitrocellulose, polyvinyl alcohol, polyvinyl pyrrolidone, a copolymer of vinylidene chloride and acrylonitrile, poly(meth)acrylates, polyvinyl chloride, a copolymer of styrene and butadiene etc. can also be used. The optimal composition of the barrier layer can be easily determined with routine experiments and will be determined by such factors as the operating temperature during transfer, decomposibility of the layer, type of image forming substance and light-to-heat converting substance used etc..

Suitable silicone resins for use in the barrier layer of the heat mode recording material in connection with the present invention preferably contain one or more components one of which is generally a linear silicone polymer terminated with a chemically reactive group at both ends and a multifunctional component as a hardening agent. The silicone resin can be hardened by condensation curing, addition curing or radiation curing.

Condensation curing can be performed by using a hydroxy terminated polysiloxane that can be cured with a multifunctional silane. Suitable silanes are e.g. acetoxy silanes, alkoxy silanes and silanes containing oxime functional groups. Generally the condensation curing is carried out in the presence of one or more catalyst such as e.g. tin salts or titanates. Alternatively hydroxy terminated polysiloxanes can be cured with a polyhydrosiloxane polymer in the presence of a catalyst e.g. dibutyltindiacetate.

Addition curing is based on the addition of Si-H to a double bond in the presence of a platinum catalyst. Silicone coatings that can be cured according to the addition curing thus comprise a vinyl group containing polymer, a platinum catalyst e.g. chloroplatinic acid complexes and a polyhydrosiloxane e.g. polymethylhydrosiloxane. Suitable vinyl group containing polymers are e.g. vinyldimethyl terminated polydimethylsiloxanes and dimethylsiloxane/vinylmethyl siloxane copolymers.

Radiation cure coatings that can be used in accordance with the present invention are e.g. U.V. curable coatings containing polysiloxane polymers containing epoxy groups or electron beam curable coatings containing polysiloxane polymers containing (meth)acrylate groups. The latter coatings preferably also contain multifunctional (meth)acrylate monomers.

Light-to-heat converting substances for use in connection with the present invention are e.g. carbon black, infrared or near infrared absorbing dyes or pigments, metals such as Bi, Sn, Te etc. or a combination thereof. Suitable infrared dyes are disclosed in e.g. U.S. Pat. No. 4,833,124, EP-321923, U.S. Pat. Nos. 4,772,583, 4,942,141, 4,948,776, 4,948,777, 4,948,778, 4,950,639, 4,950,640, 4,912,083, 4,952,552, 5,024,990, 5,023,229 etc.. Suitable infrared pigments are e.g. HEUCODOR metal oxide pigments available from Heubach Langelsheim.

Said light-to-heat converting substance may be provided in barrier layer but is preferably provided in a separate recording layer which may be comprised between donor layer and barrier layer. According to a particular embodiment the recording layer may be a vacuum deposited metal layer e.g. bismuth layer. The seperate recording layer preferably has a thickness of not more than 3 μm and more preferably of not more than 2.5 μm in order to obtain a sharp and dense image.

The separate recording layer should also be permeable at least after exposure of the heat mode recording material to allow transfer of the image forming substance contained in the underlaying donor layer to an image receiving material according to the method of the present invention. Alternatively said recording layer may be transferred together with the image forming substance to the image receiving material.

The separate recording layer that may be used in connection with the present invention may contain a binder e.g. gelatin, cellulose, cellulose esters e.g. cellulose acetate, nitrocellulose, polyvinyl alcohol, polyvinyl pyrrolidone, a copolymer of vinylidene chloride and acrylonitrile, poly(meth)acrylates, polyvinyl chloride, silicone resin etc.. The recording layer may further contain other ingredients such as e.g. wetting agents, matting agents, anti-oxidizing agents etc.

The image forming substance for use in accordance with the present invention may be e.g. a dye, dye precursor or other compound capable of providing a dye upon reaction with another compound, a pigment e.g. $TiO_2$, $SiO_2$, colloidal carbon, phthalocynaine pigments and other dye pigments, graphite, phosphor particles, ceramics, clays, metal powder such as aluminium, copper, magnetic iron and bronze, etc. or mixtures thereof.

According to the most preferred embodiment of the present invention the image forming substance is a thermally transferable dye or dye precursor. The thermally transferably dye or dye mixture is generally comprised in a binder or binder mixture.

Any dye can be used in the dye donor layer of the heat mode recording material provided it is transferable to the image receiving material during the overall heating in accordance with the method of the present invention. Examples of suitable dyes have been described in e.g. EP 432829, EP 400706, EP 485665, EP 453020 and European patent application no. 91200218.5, and in the references cited in the above documents.

The ratio of dye or dye mixture to the binder ranges from 9:1 to 1:3 by weight, preferably from 3:1 to 1:2 by weight.

At least one of the following polymers can be chosen for use as a binder for the dye donor layer: cellulose derivatives e.g. ethyl cellulose, hydroxyethyl cellulose, ethylhydroxyethyl cellulose, hydroxypropyl cellulose, methyl cellulose, cellulose nitrate, cellulose acetate formate, cellulose acetate hydrogen phthalate, cellulose acetate, cellulose acetate propionate, cellulose acetate butyrate, cellulose acetate pentanoate, cellulose acetate benzoate, and cellulose triacetate; vinyl-type resins and derivates e.g. polyvinyl alcohol, polyvinyl acetate, polyvinyl butyral, poly(vinylbutyral-co-vinylacetal-co-vinylalcohol), polyvinyl pyrrolidone, polyvinyl acetoacetal, and polyacrylamide; polymers and copolymers derived from acrylates and acrylate derivatives e.g. polyacrylic acid, polymethyl methacrylate, and styrene-acrylate copolymers; polyester resins; polycarbonates; poly(styrene-co-acrylonitrile); polysulfones; polyphenylene oxide; organosilicones e.g. polysiloxanes; epoxy resins; natural resins e.g. gum arabic.

The dye donor layer may also contain other additives such as e.g. thermal solvents, stabilizers, curing agents, preservatives, organic or inorganic fine particles, dispersing agents, antistatic agents, defoaming agents, and viscosity-controlling agents, these and other ingredients being described more fully in EP 133012, EP 111004 and EP 279467.

Especially preferred organic fine particles for use in the dye donor layer are polyethylene, polypropylene, or amide wax particles.

A dye-barrier layer comprising a hydrophilic polymer may also be provided in the heat mode recording material between the support and the dye donor layer to prevent wrong-way transfer of dye towards the support and thus enhance the dye transfer density values. The dye barrier layer may contain any hydrophilic material that is useful for the intended purpose. In general, good results have been obtained with e.g. gelatin, polyacrylamide, polyisopropyl acrylamide, butyl methacrylate-grafted gelatin, ethyl methacrylate-grafted gelatin, ethyl acrylate-grafted gelatin, cellulose monoacetate, methyl cellulose, polyvinyl alcohol, polyethylene imine, polyacrylic acid, a mixture of polyvinyl alcohol and polyvinyl acetate, a mixture of polyvinyl alcohol and polyacrylic acid, and a mixture of cellulose monoacetate and polyacrylic acid. Suitable dye barrier layers have been described in e.g. EP 227091 and EP 228065.

Between the dye layer and the support, or between the dye-barrier layer and the support, an adhesive or subbing layer can be coated such as those described in e.g. EP 433496, EP 311841, EP 268179, U.S. Pat. No. 4,727,057 and U.S. Pat. No. 4,695,288. Subbing layers such as those described in European Patent Application No. 922009071 are especially preferred.

According to an alternative embodiment the image forming substance may be contained in a thermoplastic layer so that upon heating the image forming substance together with other constituents of the thermoplastic layer is transferred to the image receiving material at the parts that were sufficiently exposed. According to a preferred mode of the present invention the thermoplastic layer comprises a thermoplastic polymer. The thermoplastic layer is preferably solid at temperatures below 40° C. and softens or melts at temperatures between 40° C. and 250° C.

Suitable thermoplastic polymers for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymer;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Poly(meth)acrylate and alpha-alkyl poly(meth)acrylate esters, e.g. polymethyl methacrylate and polyvinyl acetate;

(K) High molecular weight polyethylene oxides of polyglycols having average molecular weights from about 4,000 to 1,000,000;

(L) Polyvinyl chloride and copolymers, e.g. polyvinyl chloride/acetate, polyvinylchloride/acetate/alcohol;

(M) Polyvinyl acetal, e.g. polyvinyl butyral, polyvinyl formal;

(N) Polyformaldehydes;

(O) Polyurethanes and copolymers;

(P) Polycarbonate and copolymers;

(Q) Polystyrenes and copolymers e.g. polystyrene/acrylonitrile, polystyrene/acrylonitrile/butadiene.

To the thermoplastic polymer constituent of the thermoplastic layer there can be added non-thermoplastic polymeric compounds to give certain desirable characteristics, e.g. to adjust the adhesion to other neighbouring layers used in accordance with the present invention, wear properties, chemical inertness, etc. Suitable non-thermoplastic polymeric compounds include polyvinyl alcohol, polyvinyl pyrrolidone, cellulose, anhydrous gelatin, phenolic resins and melamine-formaldehyde resins, etc. If desired, the thermoplastic layer can also contain immiscible polymeric or non-polymeric organic or inorganic fillers or reinforcing agents which are essentially transparent at the wave-lengths used for the exposure of the photopolymeric material, e.g. the organophilic silicas, bentonites, silica, powdered glass, colloidal carbon, as well as various types of dyes and pigments in amounts varying with the desired properties of the thermoplastic layer. The fillers are useful in improving the strength of the composition, reducing tack etc..

Agents to improve the wetting and/or adjust the adhesion of the thermoplastic layer may be added. Suitable agents are e.g. silicones, silicon containing polymers e.g. a poly(dimethylsiloxane)-polyether copolymer, poly(dimethylsiloxane)-polyester, silicon containing surfactants, fluor containing copolymers and fluor containing surfactants etc.

According to a particular variant the thermoplastic layer may comprise a polymerizable composition. Such offers the advantage that after thermal transfer of the thermoplastic layer together with the image forming substance incorporated therein the transferred image can be cured so that a highly wear and scratch resistant image can be obtained on the image receiving material.

Preferably used supports for the heat mode recording material of the present invention are e.g. polyester film e.g. polyethylene terephthalate, polyethylene, polypropylene, copolymers of styrene and acrylonitrile, polyvinyl chloride, polycarbonate and polyvinylidene chloride. The support may also be colored e.g. a blue colored polyester film support can be used in accordance with the present invention. Other supports suitable for use in connection with the present invention are e.g. paper supports.

According to the method of the present invention, after image-wise exposure, the above described heat mode recording material is rubbed under dry conditions or with the add of non-solvent for the barrier layer and is then overall heated whilst in contact with an image receiving material. Suitable image receiving materials can be a transparent film of e.g. polyethylene terephthalate, a polyether sulfone, a polyimide, a cellulose ester, or a polyvinyl alcohol-co-acetal. The image receiving material may also be a reflective one such as baryta-coated paper, polyethylene-coated paper, or white polyester i.e. white-pigmented polyester. Blue-colored polyethylene terephthalate film can also be used as a support.

The image receiving material is preferably provided with a layer showing a high affinity for the image forming substance being transferred so that said image forming substance is readily fixed to the image receiving material.

For example to avoid poor adsorption of a thermally transferred dye to the receiving material the support thereof can be coated with a special coating, called dye-receiving layer. This layer may comprise e.g. a polycarbonate, a polyurethan, a polyester, a polyamide, polyvinyl chloride, poly(styrene-co-acrylonitrile), and polycaprolacton or mixtures thereof. Suitable dye-receiving layers have been described in e.g. EP 133011, EP 133012, EP 144247, EP 227094, EP 228066. The dye-receiving layer may also comprise a cured binder such as the heat-cured product of poly(vinylchloride-co-vinyl acetate-co-vinyl alcohol)and polyisocyanate.

In order to improve the light resistance and other stabilities of recorded images, UV absorbers, singlet oxygen quenchers such as HALS-compounds (Hindered Amine Light Stabilizers) and/or antioxidants can be incorporated into the dye-receiving layer.

The dye-receiving layer of the receiver sheet may also contain a releasing agent that aids in separating the heat mode recording material from the receiver sheet after transfer. The releasing agents can also be provided in a separate layer on at least part of the dye-receiving layer. Solid waxes, fluorine- or phosphate-containing surfactants and silicone oils can be used as releasing agent. Suitable releasing agents have been described in e.g. EP 133012, JP 85/19138, and EP 227092.

According to another embodiment of the present invention the support of the image receiving material may be provided with a layer containing a polymer having polymerizable groups in its side chain. This offers the advantage that in case a polymerizable composition being contained in the heat mode recording material e.g. in the donor layer containing the image forming substance and being transferable together with the image forming substance, curing of the transferred image will improve the adhesion of the image to the image receiving material in addition of an improvement of the wear and scratch resistance of the image. Suitable polymers for this purpose are e.g. polymers comprising vinyl groups, allyl groups, (meth)acrylate groups, butadiene groups, isoprene groups etc., e.g. acrylated epoxies, polyester acrylates, urethane acrylates etc.. They may be prepared by modification of polymers e.g. modification of polymers containing hydroxyl groups e.g. polyvinyl alcohol, polyesters with hydroxyl functions, copolymers of styrene and allylalcohol, phenoxy resins, cellulose, dextranes etc. with carboxilic acid or acid halides, modification of polymers containing epoxy groups with diallylamine, modification of polymers containing amino groups, isocyanate groups, anhydride groups, alkyl chloride groups, silanol groups etc..

The overall heating temperature used in accordance with the method of the present invention to cause transfer of the image forming substances at the sufficiently exposed parts of the heat mode recording material depends on such parameters as the particular image forming substance to be transferred, the binder and possible other ingredients of the layer containing the image forming substance, the thickness of said layer, the thickness of the barrier layer etc. A practical working temperature however is preferably between 40° C. and 400° C. and more preferably between 60° C. and 350° C. and most preferably between 60° C. and 150° C.

Overall heating may be carried on the heat mode recording material only or the image receiving material as well. The transfer of the image forming substance can further be improved by applying simultaneously a pressure while heating the sandwich of the heat mode recording material and image receiving material.

The overall heating in accordance with the present invention is preferably carried out by conveying the sandwich of the heat mode recording and receiving material through a pair of roles of which at least the one in contact with the heat mode recording material is heated to the temperature necessary for causing transfer of the image forming substance.

Image-wise exposure with intense radiation is preferably carried out by means of a laser. Preferably used lasers are e.g. semiconductor lasers, YAG lasers e.g. Nd-YAG lasers, Argon lasers etc. The laser may have a power output between 40 and 7500 mW and preferably operates in the infrared part of the spectrum.

When the above described method is carried out for but one color a monochrome dye image is obtained on the image receiving material. A multi color image can be obtained according to the above described method by superimposing at least two primary colors on the same image receiving material using at least two heat mode recording materials whereby each holds one of the different primary colors. The superposition of the primary colors will be carried-out in register to obtain a faithful reproduction of the original.

The present invention will now be illustrated by the following examples without limiting it thereto. All parts are by weight unless otherwise specified.

EXAMPLE 1

Onto a subbed polyethylene terephthalate support having a thickness of 63 μm a thermally transferable dye having a structural formula as defined hereinafter was coated from a 10% solution in methyl ethyl ketone of nitrocellulose serving as binder. The dry coverage of dye was equal to that of the binder and corresponded to 1 g/m².

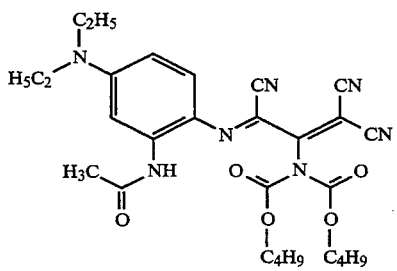

Subsequently a 150 nm thick bismuth layer was applied by vapour deposition under a reduced pressure as described in published European patent application No. 0 384 041.

The bismuth layer was then overcoated with a silicon layer to a dry thickness of 2.5 g/m² using the following coating solution:

| | |
|---|---|
| EXXSOL DSP 80/110 naphta[1] | 379.5 g |
| vinyl terminated dimethylpolysiloxane | 95 g |
| SYL-OFF 7367[2] | 4 g |
| divinyltetramethyl disiloxane complex of platinum (containing 1.5% of xylene) | 0.56 g |

[1]Exxsol DSP 80/110 is a naphta i.e. a mixture of paraffins and in which the content of aromatics has been reduced.
[2]Syl-off 7367 is the cross-linker used and is a solution of 71% of methyl hydrogen polysiloxane in ethynylcyclohexene.

The silicon surface layer was then cured by heating the sample during 5 min. at 130° C.

The above prepared heat mode recording material was subjected to laser beam recording using a Nd-YAG laser emitting at 1064 nm. The laser spot projected on the heat mode recording material had a width of 6.5 μm at the 1/e² value of the spot intensity peak. The power of the light energy striking the metal layer was in the range of 120 to 220 mW and the writing proceeded with a pixeltime of 200 ns.

The thus obtained image-wise exposed heat mode recording material was then rubbed with a dry cotton pad so that the decomposed silicone layer at the exposed parts was removed.

The recording material was then brought into contact with the image-receiving layer of a commercial thermal dye transfer material. The contacting materials were conveyed through the nip formed by an upper solid silicon rubber roller (diameter 4.5 cm) contacting the back of the image-receiving material and a lower hollow aluminum roller coated with a polytetrafluoroethylene layer (diameter of the coated roller 9 cm) contacting the back of the recording material. Inside the aluminum roller an infra-red radiation source serving as heating source was arranged.

The heat applied for the thermal dye transfer is controllable by the power of the infra-red radiation source and the transport speed of the contacting materials.

A fog free transfer of dye on the image-receiving material was obtained with a transport of 10 cm per second with the aluminum roller kept at 110° C.

We claim:

1. A method for obtaining an image comprising the steps of:
   image-wise exposing to intense radiation a heat mode recording material comprising on a support (i) a donor layer containing an image forming substance capable of being transferred upon heating to an image receiving material, (ii) a barrier layer being impermeable for said image forming substance and overlaying said donor layer, and (iii) a light-to-heat converting substance, capable of absorbing the light used for exposing said heat mode recording material and releasing the absorbed energy under the form of heat, said light-to-heat converting substance being present in said barrier layer or in a separate layer between said donor layer and barrier layer,
   rubbing, under dry conditions or by means of a nonsolvent for the barrier layer, the thus obtained image-wise exposed heat mode recording material to remove said barrier layer at the exposed parts, and
   overall heating the exposed heat mode recording material while in contact with an image receiving material thereby causing an image-wise transfer of said image forming substance to said image receiving material.

2. A method according to claim 1 wherein said barrier layer contains a hardened silicone resin.

3. A method according to claim 1 wherein said light-to-heat converting substance is contained in a separate recording layer located between said barrier layer and donor layer.

4. A method according to claim 3 wherein said recording layer has a thickness of not more than 3 μm.

5. A method according to claim 1 wherein said donor layer is a thermoplastic layer.

6. A method according to claim 1 wherein said image forming substance is a thermally transferable dye.

7. A heat mode recording material comprising on a support in the order given a donor layer containing an image forming substance capable of being transferred upon heating to an image receiving material, a recording layer containing a light-to-heat converting substance capable of absorbing the light used for exposing said heat mode recording material and releasing the absorbed energy under the form of heat and a barrier layer being impermeable for said image forming substance.

8. A heat mode recording material according to claim 7 wherein said recording layer has a thickness of not more than 2.5 µm.

9. A heat mode recording material according to claim 7 or 8 wherein said barrier layer contains a hardened silicone resin.

* * * * *